United States Patent
Kaizuka

(10) Patent No.: US 7,227,426 B2
(45) Date of Patent: Jun. 5, 2007

(54) USING HYSTERESIS TO GENERATE A LOW POWER CLOCK

(75) Inventor: Masao Kaizuka, San Jose, CA (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 0 days.

(21) Appl. No.: 11/049,420

(22) Filed: Feb. 2, 2005

(65) Prior Publication Data

US 2006/0061428 A1  Mar. 23, 2006

Related U.S. Application Data

(60) Provisional application No. 60/541,440, filed on Feb. 2, 2004.

(51) Int. Cl.
*H03B 5/32* (2006.01)
(52) U.S. Cl. ............... 331/186; 331/160; 331/183
(58) Field of Classification Search ............ 331/160, 331/186; 368/159
See application file for complete search history.

(56) References Cited

U.S. PATENT DOCUMENTS 3,959,744 A * 5/1976 O'Connor ............ 331/116 FE
4,710,730 A   12/1987 Doyle, III
5,502,406 A   3/1996 Traynor et al.
5,546,055 A   8/1996 Klughart
6,091,307 A * 7/2000 Nelson ................. 331/109
6,611,918 B1  8/2003 Uzelac
2003/0132741 A1  7/2003 Senthilkumar et al.

* cited by examiner

*Primary Examiner*—Joseph Chang
(74) *Attorney, Agent, or Firm*—Tucker Ellis & West LLP

(57) ABSTRACT

A real time clock that operates an oscillator within a predetermined range by employing a constant current source. The remaining real time clock logic can be operated at a voltage that is relative to the constant current. Power consumption of the oscillator can be controlled by limiting the current from the constant current source. The outputs of the oscillator can be input into a signal detector. A clocking signal can be produced by the signal detector based on the oscillator signals. The current provided by the first current source is limited to provide low power operation of the oscillator. Optionally, the signal detector can employ a differential amplifier. The differential amplifier receives the oscillator outputs, and provides a clocking signal based on the oscillator outputs.

18 Claims, 8 Drawing Sheets

Typical Oscillator Power consumption characteristic

IDD Variation for VDD = 1.5 ±0.1 V Specification

Example of Constant Current Model

Hysteresis Characteristics of the Amplifier

USING HYSTERESIS TO GENERATE A LOW POWER CLOCK

CROSS-REFERENCE TO RELATED APPLICATIONS

This application claims the benefit of priority of U.S. Provisional Application No. 60/541,440 filed Feb. 2, 2004.

BACKGROUND OF THE INVENTION

The present invention relates generally to circuits for providing clocking signals and more specifically to techniques for improving the power consumption of a real time clock.

Crystal oscillators are often used to provide a clock signal to a data processing application. For many devices, the crystal oscillator is powered all of the time. Typically, when crystal oscillators are used in a real time clock application, lithium batteries are often used to provide power. Lithium batteries can have a life span of many years when the oscillator dissipates only a minimal amount of power.

However, reducing power consumption for contemporary high speed Complementary Metal Oxide Semiconductor (CMOS) devices, such as CMOS devices at 0.13 micrometers or less, can be difficult. These high performance devices typically use lower circuit threshold transistors, which can have considerable leakage currents. Another problem with these devices is that their power supply voltages can vary. For example, typical 0.13 micro-meter CMOS device uses a 1.5 Volt power supply, and a 90 nano-meter CMOS device usually uses a 1.2 volt power supply, while the typical lithium battery supplies 3V. Thus, a real time clock that dissipates a minimal amount of power is desirable. Furthermore, it is desirable that the real time clock can be implemented using high performance CMOS devices.

BRIEF SUMMARY OF THE INVENTION

The present invention relates to a real time clock with minimal power needs. In accordance with an aspect of the present invention, the real time clock can operate an oscillator with a constant current source, and the remaining real time clock logic can be operated at a voltage that is relative to the constant current. Power consumption of the oscillator can be controlled by limiting the current from the constant current source.

In accordance with an aspect of the present invention, there is described herein a real time clock comprising a regulator circuit, an oscillator and a voltage reference circuit. The regulator comprises a first current source and a second current source. The oscillator is coupled to the first current source, the first current source limiting the output voltage of the oscillator. The voltage reference circuit coupled to the second current source and provides a reference voltage to the regulator circuit.

In accordance with an aspect of the present invention, there is described a real time clock comprising a first current source, a second current source, an oscillator and a signal detector. The oscillator is coupled to the first current source and produces first and second outputs. The outputs of the oscillator are input into the signal detector. The clocking signal being produced by the signal detector and based on the oscillator signals. The current provided by the first current source is limited to provide low power operation by the oscillator. Optionally, the signal detector can be a differential amplifier. The differential amplifier receives the first oscillator output and the output of the differential amplifier providing the clocking signal.

In accordance with another aspect of the present invention, there is disclosed herein a method for generating a clock signal. The method comprises biasing an oscillator with a first current and biasing a signal detector with a second current. The outputs of the oscillator are sent to a signal detector and the clock signal is obtained from the output of the signal detector.

Still other objects of the present invention will become readily apparent to those skilled in this art from the following description wherein there is shown and described a preferred embodiment of this invention, simply by way of illustration of one of the best modes best suited for to carry out the invention. As it will be realized, the invention is capable of other different embodiments and its several details are capable of modifications in various obvious aspects all without from the invention. Accordingly, the drawing and descriptions will be regarded as illustrative in nature and not as restrictive.

BRIEF DESCRIPTION OF THE SEVERAL VIEWS OF THE DRAWING

The accompanying drawings incorporated in and forming a part of the specification, illustrates several aspects of the present invention, and together with the description serve to explain the principles of the invention.

DETAILED DESCRIPTION OF INVENTION

Throughout this description, the preferred embodiment and examples shown should be considered as exemplars, rather than limitations, of the present invention. The present invention relates to a technique for implementing a real time clock with low power consumption. The present invention, in accordance with an aspect, operates an oscillator with a constant current source while operating the rest of the real time clock logic with a voltage relative to the constant current source.

In accordance with an aspect of the present invention, current consumption can be set to a desired level to achieve a desired battery life. For example, a lithium battery can have a capacity of about 220 milliamp-Hours (mAH). A suitable time frame for battery life can be selected, e.g., 10 years, which then determines the current consumption. Using the example of a 220 mAH battery and a desired time frame of 10 years, then:

$$\text{Battery Life (years)} = \frac{\text{Battery Capacity (mAH)} \times 10^{-3}}{24 \text{ (hour)} \times 365 \text{ (days)} \times Idd \text{ } (\mu A) \times 10^{-6}}$$

Where Idd=Power Consumption in μA. Rearranging, the maximum current consumption $Idd_{MAX}$ is:

$$Idd_{MAX}(\mu A) = \frac{220 \text{ (mAH)} \times 10^{-3}}{24 \text{ (hour)} \times 365 \text{ (days)} \times 10 \text{ (years)} \times 10^{-6}} \approx 2.5 \text{ } (\mu A)$$

Therefore, in order to achieve a desired battery life of 10 years, the maximum current should be less than approximately 2.5 micro-amps.

Figure 4:
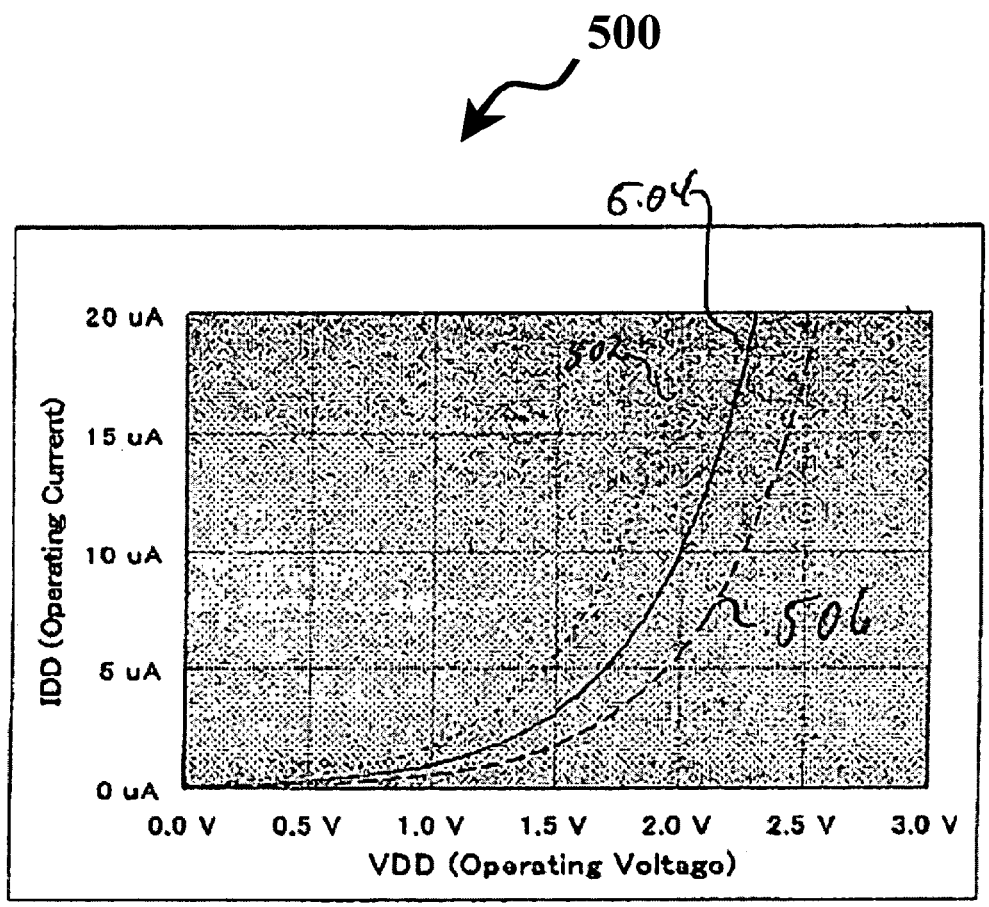
FIG. 4 is a graphical example of typical oscillator power consumption characteristics.
Figure 5:
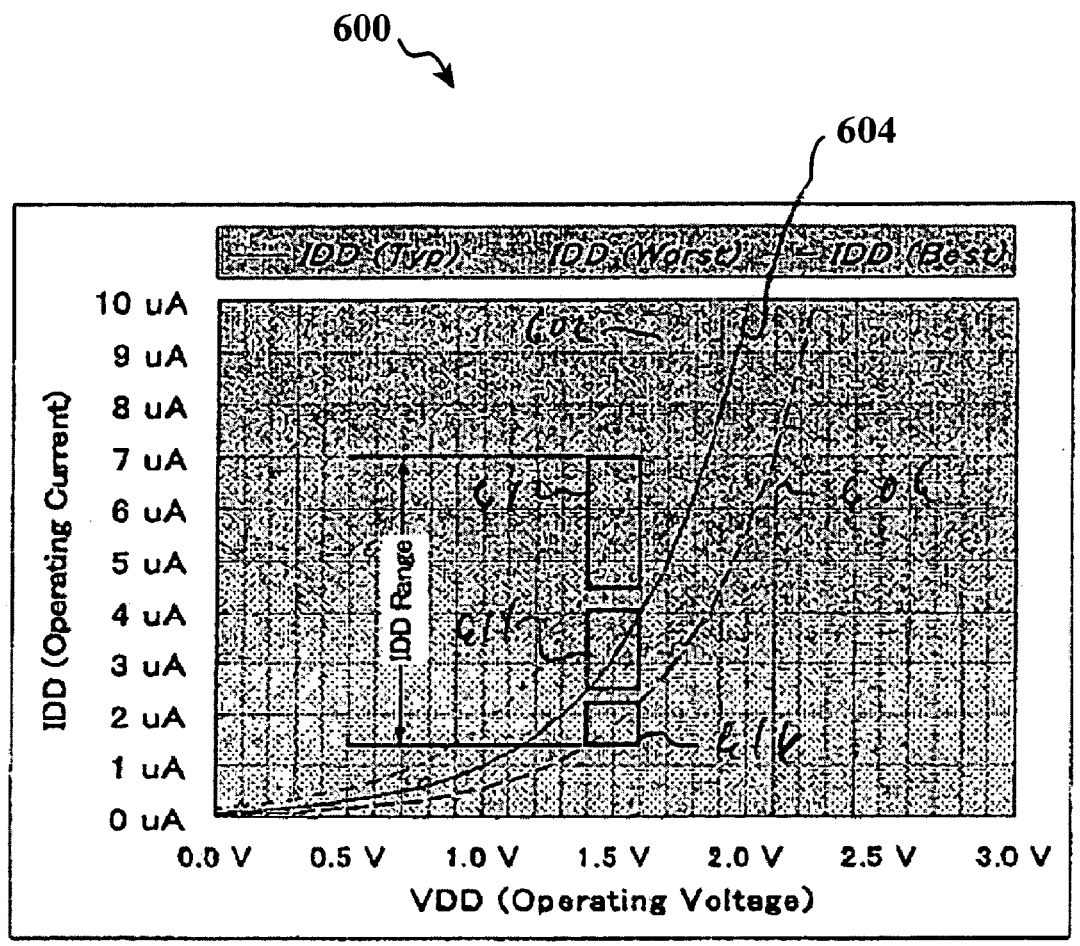
FIG. 5 is a graphical example illustrating typical current fluctuations as a function of voltage variations.
Figure 6:
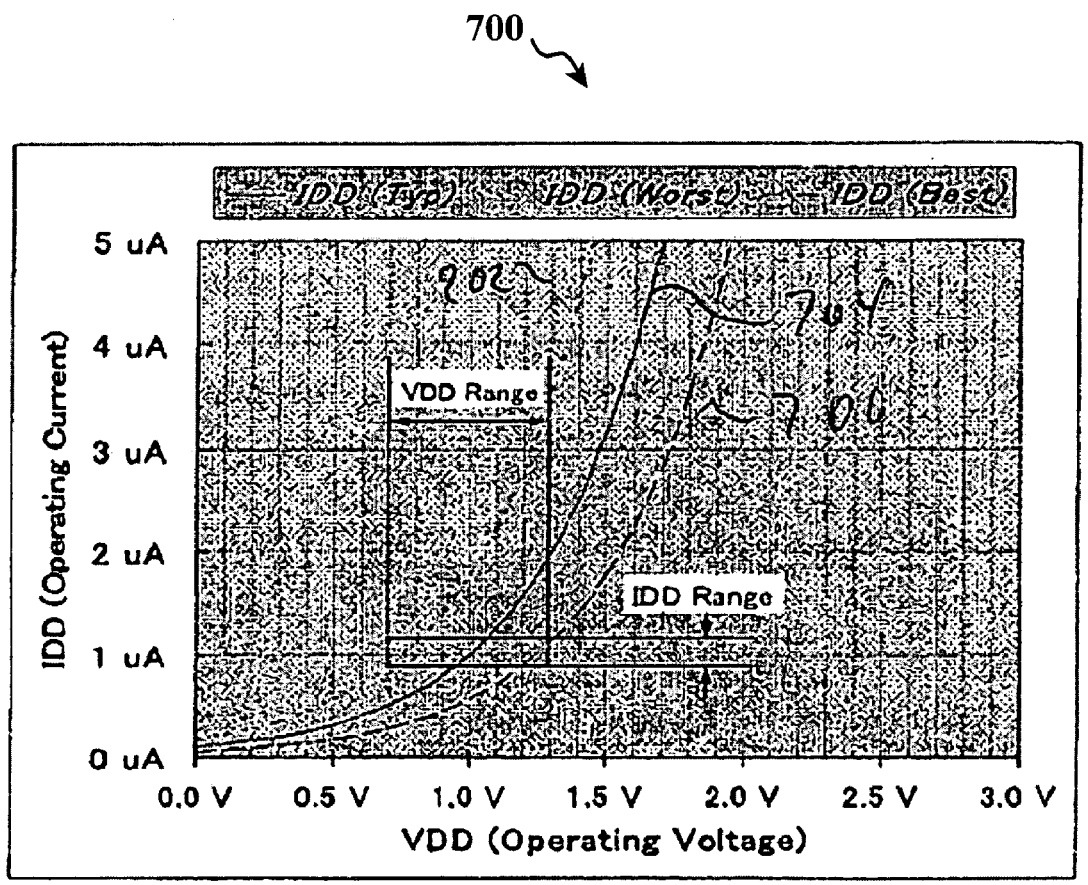
FIG. 6 is an example of a constant current model illustrating current variations for typical voltage ranges.

The power consumption of a CMOS circuit in conventional logic is determined by the formula:

$$Pd = \text{freq} \times C \times V^2$$

where freq=operating frequency, C=total capacitance, and V=operating voltage. However, in the case of an oscillator circuit that is operating as an analog circuit, the power consumption can be determined by the power supply voltage and circuit threshold voltage. Referring to FIG. 4, there is shown a graphical example 500 of operating current (IDD) plotted against operating voltage (VDD) of a CMOS oscillator circuit. Curve 502 illustrates a worst case scenario, curve 504 illustrates an exemplary scenario, and curve 502 illustrates a best case scenario. FIG. 5 is a graphical example 600 based on the same example data used in FIG. 5, but estimates the range of IDD when VDD is within 0.1 V of 1.5 V (e.g. a typical voltage range for a 0.13 micro-meter CMOS device), or VDD is between 1.4 V and 1.6 V. In the worst case scenario 602 IDD ranges from 4.5 micro-amps to 7 micro-amps. For the typical scenario 604, IDD ranges from 2.5 micro-amps to 4.0 micro-amps, while for the best case scenario 606 IDD ranges from 1.3 micro-amps to approximately 2.2 micro-amps. Overall, the range of IDD when VDD ranges from 1.4 V to 1.6 V can be 1.3 micro-amps to 7 micro-amps. In FIGS. 4 and 5, reducing VDD causes a corresponding reduction in IDD. Using the example of limiting power consumption to 2.5 micro-amps, VDD would have to be limited to 1.2 V to meet the desired power consumption rate. However, the desired power consumption includes not only the oscillator, but the remaining logic for the real time clock circuit and leakage current. Referring now to FIG. 6, there is illustrated an example of VDD plotted against IDD for a constant current model of a CMOS oscillator. In this example, IDD's range within 0.1 micro-amp of 1 micro-amp, or is between 0.9 micro-amps and 1.1 micro-amps. For the worst case scenario 702, VDD ranges from 0.7 V to 0.8 V. For the typical scenario 704 VDD ranges from 0.9 V to 1.1 V. For the best case scenario 706, VDD ranges from 1.2V to 1.3V. Thus, in accordance with an aspect of the present invention, power consumption is limited by regulating the amount of current supplied to the real-time clock instead of the voltage.

Figure 1:
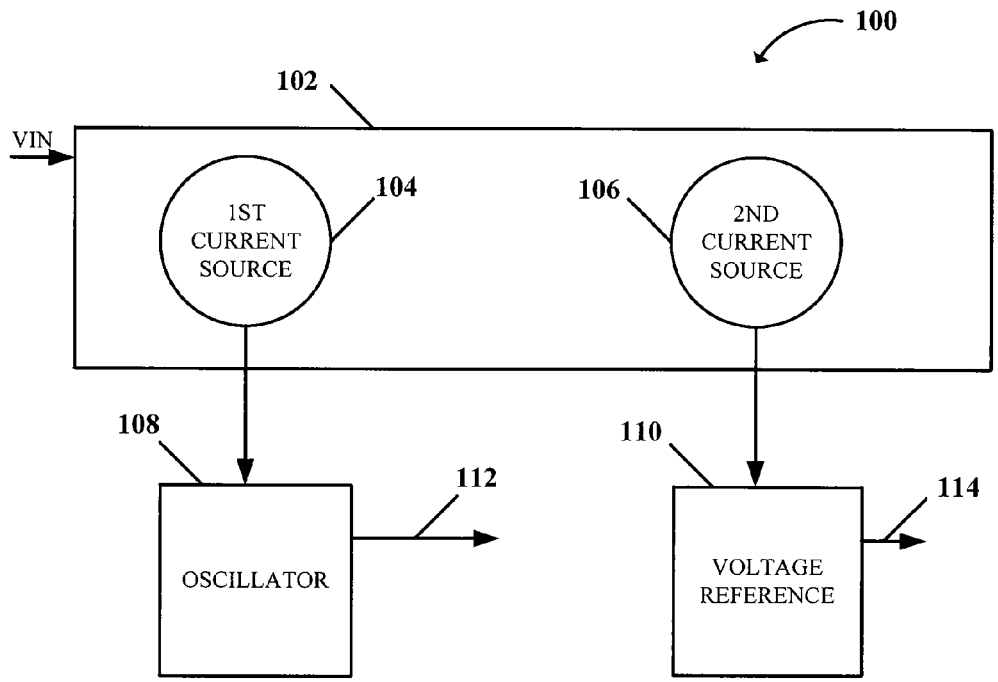
FIG. 1 is a block diagram illustrating a real time clock in accordance with an aspect of the present invention.

FIG. 1 is a block diagram illustrating a real time clock 100 in accordance with an aspect of the present invention. A regulator 102 is used for regulating current sources 104 and 106. Regulator 102 receives a voltage VIN, (e.g., from a battery). Regulator 102 can limit power consumption by limiting the current supplied by current sources 104, 106. Oscillator 108 receives current from current source 104 and produces an output 112. The output 112 can be used as a clocking signal. Voltage reference 110 receives current from a second current source 106 that is also a part of regulator 102. Voltage reference 110 produces an output 114 that can be used as a voltage source for the components of real time clock 100, except for oscillator 108. For example, by limiting the current to oscillator 108, voltage output by oscillator 108 can be less than the voltage for the remaining logic of real time clock 100, reducing the power consumed by oscillator 108. The source voltage for the remaining components of real time clock 100 can be obtained from voltage reference 110. Regulator 102 can control the amount of current from current sources 104 and 106 to obtain a desired level of power consumption.

In operation, the current from the first current source 104 limits the amount of current to oscillator 108. Because oscillator 108 is responsive to the current from the first current source, the voltage at the output 112 of oscillator 108 is limited. The current from current source 104 can be selected so that the voltage at the oscillator output is lower than the reference voltage. Furthermore, current sources 104, 106 can be controlled to limit the total amount of current supplied to real time clock 100, consequently controlling the power consumption of real time clock 100.

Real time clock 100 can further comprise digital logic (not shown). The digital logic can have transistors that have a threshold voltage. The voltage reference circuit 110 can be configured to employ two monitor transistors (not shown) that generate a reference voltage that is proportional to the threshold voltage of transistors employed in the digital logic.

Figure 2:
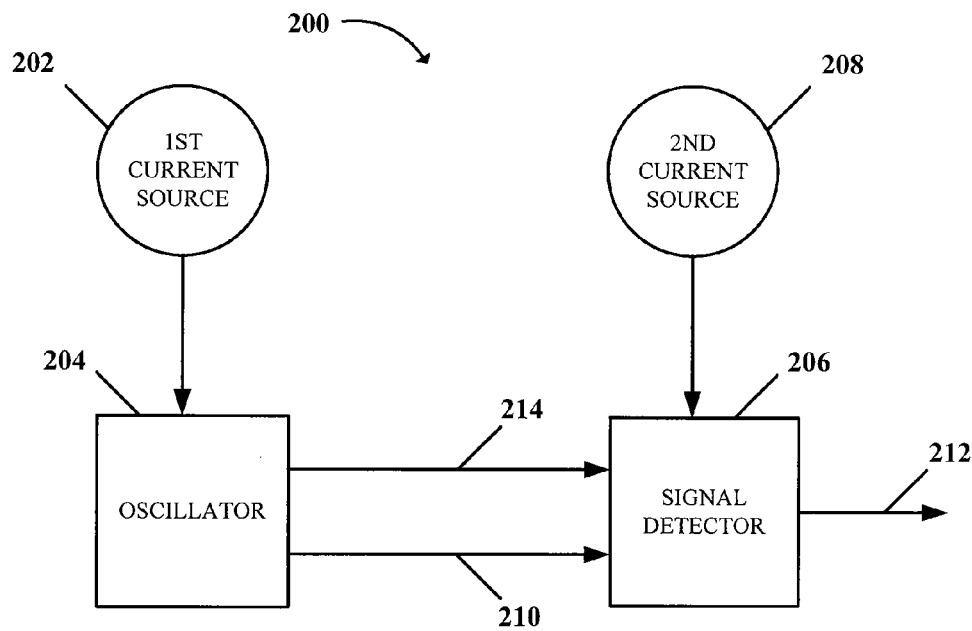
FIG. 2 is a block diagram of a real time clock with an oscillator and a signal detector in accordance with an aspect of the present invention.

FIG. 2 is a block diagram of a real time clock 200 with an oscillator 204 and a signal detector 206 in accordance with an aspect of the present invention. Current source 202 is used to provide limited current to oscillator 204. Oscillator 204 then produces outputs 208, 210 responsive to the limited current. The magnitude of the voltage at outputs 208, 210 is determined by the magnitude of the limited current. Outputs 210, 214 are input into signal detector 206. Signal detector 206 receives current from current source 208. Signal detector 206 produces an output 212 based on the signals received from oscillator outputs 210, 214. Signal detector 206 can produce an output 212 at a different voltage level than oscillator outputs 210, 214. This can be useful for limiting the power consumption of oscillator 204. Output 212 can be used as a clocking signal. A differential amplifier can be employed by signal detector 206 for producing output 212 based on the difference between oscillator outputs 210, 214. Current sources 202, 208 can be controlled so that current source 202 produces a lower amount of current than current source 208, or current sources 202, 208 can be controlled to limit the power consumption of real time clock 200 to at or below a predetermined threshold.

Figure 3:
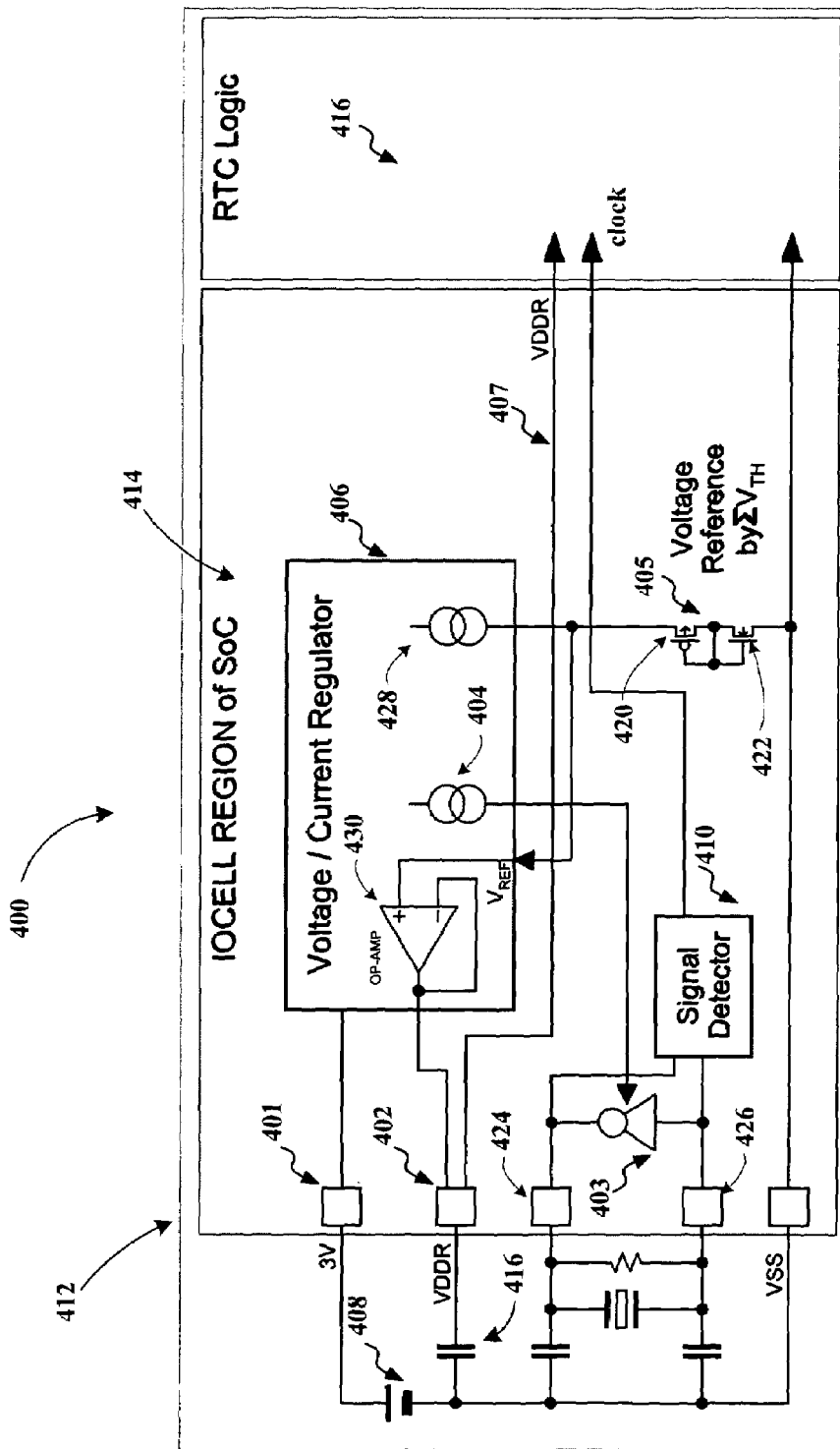
FIG. 3 is a circuit diagram of a real time clock in accordance with an aspect of the present invention.

FIG. 3 is a circuit diagram of a real time clock 400 in accordance with an aspect of the present invention. Real time clock 400 is implemented on a System on Chip (SoC) 412 design. The System on Chip 412 comprises an Input/Output Cell region (IOCELL) 414 and real time clock logic (RTC logic) region 416. Battery 408 is connected to power supply terminal 401, providing power to Voltage/Current Regulator 406. The opposing terminal of battery 408 is connected to terminal 402, a regulated voltage terminal having a regulated voltage VDDR via decoupling capacitor 416, and the opposing terminal of battery 408 is connected to VSS. Terminal 402 is also coupled to voltage/current regulator 406, and provides a regulated power supply 407 for internal logic, including real time clock logic 416. Current source 404, within voltage/current regulator 406, provides current to oscillator inverter 403. Oscillator inverter 403 produces an output voltage on terminals 424, 426. The magnitude of the voltages at terminals 424, 426 can be controlled by limiting the current from current source 404 to oscillator 403.

Voltage reference circuit 405 receives current from a second current source 428. Second current source 428 is also a part of voltage/current regulator 406. Voltage reference circuit 405 is composed of two monitor transistors 420, 422, which produce a voltage VREF that is proportional to the current received from second current source 428. VREF is input into Op Amp 430, which maintains VDDR at VREF. Voltage/current regulator 406 can be suitably adapted to make the current from second current source 428 proportional to the current supplied by first current source 404, and as a result the reference voltage VREF can be proportional to the current supplied by first current source 404. VREF is fed back to voltage/current regulator 406, Thus, voltage/current regulator 406 can control the power consumption of real time clock 400 by controlling the amount of current supplied by current sources 404, 428 and as a consequence the reference voltage VREF produced by voltage reference circuit 405.

Oscillator inverter 403 is coupled to signal detector 410. As shown, signal detector 410 receives regulated voltage VDDR, however, signal detector 410 can be powered from another voltage or current source if desired. Signal detector 410 produces a single output (CLOCK) that can be used as a clocking signal by real time clock logic 409 based on the two signals received from oscillator inverter 410. For example, signal detector 410 can employ a differential amplifier (not shown) to produce the output CLOCK. This enables the output of oscillator inverter 403 to be operated at a reduced voltage, realizing additional power savings. Regulated voltage VDDR and VSS are supplied to the logic (not shown) contained in real time clock logic 416.

Figure 7:
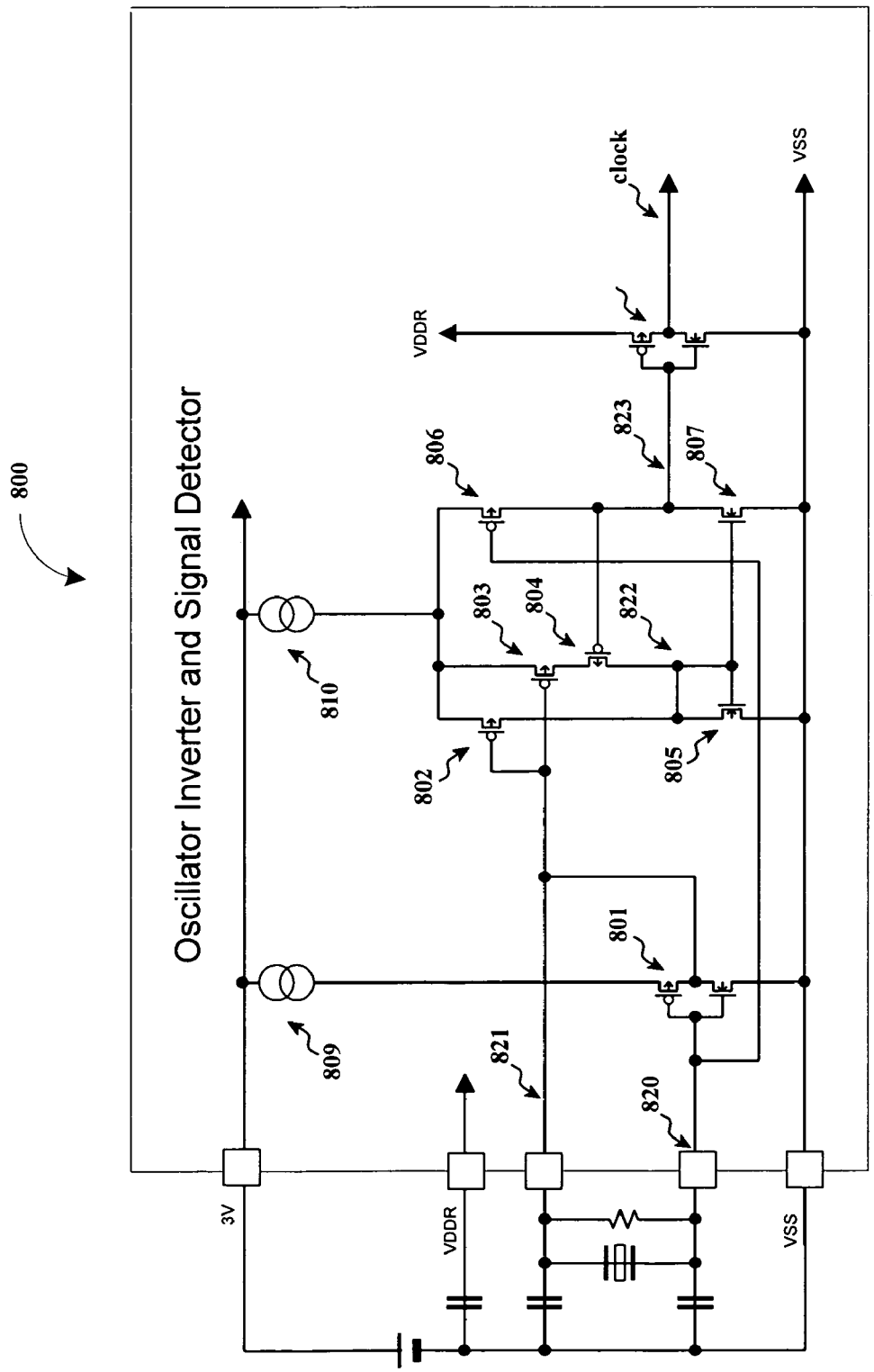
FIG. 7 is a circuit diagram of an oscillator and signal detector in accordance with an aspect of the present invention.
Figure 8:
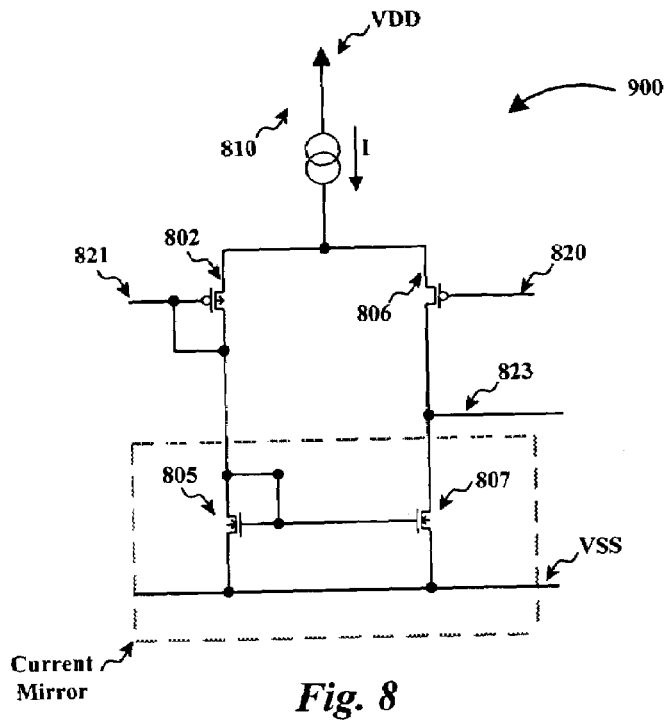
FIG. 8 is a simplified diagram of a differential amplifier circuit.

FIG. 7 is a circuit diagram 800 of an oscillator and a signal detector in accordance with an aspect of the present invention. Oscillator Inverter 801 is oscillating with using limited current supplied by current source 809. Because the current is limited, the voltage at nodes 820 and 821 should be small. Using the example of FIG. 7, if the current is limited to 1 micro-amp, or between 0.9 micro-amp and 1.1 micro-amp, then the voltages at nodes 820 and 821 should range between 0.7 and 1.3 volts.

Transistors 802, 803, 804, 805, 806, 807 and current source 810 form a differential amplifier. The differential amplifier amplifies the signals on nodes 820 and 821. The output of the differential amplifier appears at node 823. The output at node 823 is feedback to transistor 804, controlling transistor 803.

As an example, to explain the operation of transistors 803 and 804, transistor 802 can be a transistor with a channel width X, transistor 806 can have a channel width of 3× or three times the channel length of transistor 802, while transistor 803 has a channel width of 8×, or eight times the channel width of transistor 803. When transistor 804 is turned off, the differential amplifier resembles the differential amplifier 900 illustrated in FIG. 9 formed by transistors 802, 805, 806, 807 and current source 810. Transistors 805 and 807 form a current mirror. The current flow through transistors 805 and 807 is proportional to the channel width of transistors 805 and 807. For example, if the channel widths of transistors 805 and 807 are substantially equal, then the current flowing through transistors 805 and 807 will be substantially equal. For this example, assume that the width of transistor 802 is substantially equal to the width of transistor 806. In operation, when the input voltage of transistor 802 (or node 821) and transistor 806 (or node 820) are substantially equal, then the voltage at node will be near the middle of the voltage range of VDD (e.g., 3V) and VSS (e.g. 0V), or approximately 1.5V.

As the input voltage of transistor 802 decreases relative to the input voltage of transistor 806, the current through transistor 802 will increase and the current through transistor 806 will decrease. The current through transistor 802 goes to transistor 805, and because of the current mirror transistor 807 will have substantially the same current as well. As a result, transistor 807 will sink more current than transistor 806, therefore, node 823 will decrease towards VSS (e.g., 0V). By contrast, as the input voltage of transistor 802 increases relative to transistor 806, then the current flow in transistor 806 increases resulting in more current flowing in transistor 806. As more current flows through transistor 806, then the voltage at output node 823 will increase.

Referring back to FIG. 7, the size of the channel widths of transistors 802, 803 and 806 can be intentionally varied. For example, the width of transistor 806 can be three times larger than the width of transistor 802. Because of this difference, the current flow through transistor 806 is larger than transistor 802 when the input voltages of transistors 802 and 806 are substantially the same. The current through transistors 802 and 806 can be the same when the input voltage of transistor 802 is lower than the input voltage transistor 806 by a voltage known as an offset voltage (VOFFSET). In other words, the current flow in transistor 802 is the same as transistor 806 when input voltage (transistor 802)+VOFFSET=input voltage(transistor 806).

When the input voltage at transistor 802 is higher than the input voltage of transistor 806, then output node 823 is at a high level. Because output node 823 is at a high level, transistor 804 will be OFF (not conducting), and therefore transistor 803 is also OFF.

However, as the inputs of transistors 802 and 806 are changed in opposite directions (e.g., transistor 802's input voltage is decreasing and transistor 806's input voltage is increasing), when the input voltage of transistor 802+VOFFSET is substantially equal to the input voltage of transistor 806, then output node 823 will go to a low level. Consequently, transistor 804 will be ON. Transistor 803 has its input connected to the same input as transistor 802. Therefore, when transistor 804 turns ON, transistor 803 is joins transistor 802. Because transistor 803 has the same input voltage as transistor 802 and has a width of 8×, while transistor 802 has a width of 1× and transistor 806 has a width of 3×, the combination of transistors 802 and 803 has a width of 9× and will conduct three times the amount of current of transistor 806 when the input voltages are substantially the same. Based on the characteristic that the offset voltage is dependent on the ratio of current, then the same offset voltage will result. In other words, Voltage(transistors 802 and 803)–VOFFSET=Voltage(transistor 806).

Optionally, an inverter 808 can be coupled to output node 823. The output of inverter 808 (CLOCK) is the inverted output of node 823. Thus, when node 823 is at a logic high level, CLOCK is at a logic low level and when node 823 is at a logic low level, clock is at a logic high level. Alternatively, a buffer circuit (not shown) can be used instead of an inverter.

Figure 9:
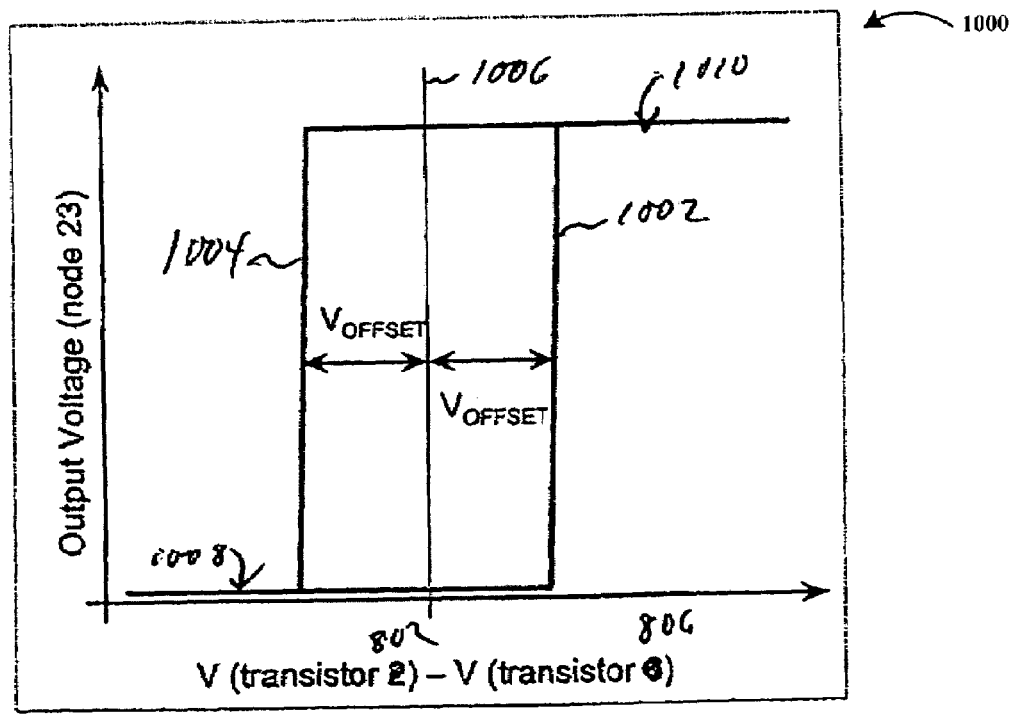
FIG. 9 is a graphical example of hysteresis characteristics of a signal detector in accordance with an aspect of the present invention.

FIG. 9 illustrates the hysteresis characteristics of the differential amplifier described in the example use to describe FIG. 7 by plotting the Output Voltage at node 823 against the input voltage of transistor 802 and the input transistor of transistor 806, Voltage(transistor 802)–voltage transistor 806. The voltage at 1006 represents when Voltage (transistor 802) is substantially the same as Voltage(transistor 806). Starting when the output voltage at node 823 is low 1008, the output voltage stays low until the input voltage at 802 increases to more than VOFFSET higher than the input voltage of transistor 806 at 1002. This can be accomplished either by increasing the input voltage of transistor 802, decreasing the input voltage of transistor 806, or a combination of increasing the input voltage of transistor 802, decreasing the input voltage of transistor 806. Output voltage 823 then goes to high state 1010.

When the output voltage is in the high state 1010, as the input voltage of transistor 806 increases relative to the input voltage of transistor 802, which can be accomplished either by increasing the input voltage of transistor 806, decreasing the input voltage of transistor 802, or by a combination of increasing the input voltage of transistor 806, decreasing the input voltage of transistor 802, the output voltage 823 remains at the high level 1010 until the input of transistor 802 is approximately VOFFSET lower than the input voltage of transistor 806 at 1004. At 1004, output voltage 823 goes to the low state 1008.

The hysteresis characteristics of the differential amplifier can be varied by varying the channel width of transistors 802, 803 and/or 806. Varying the channel characteristics of the transistors changes VOFFSET and consequently the width of the hysteresis characteristic of the amplifier.

Figure 10:
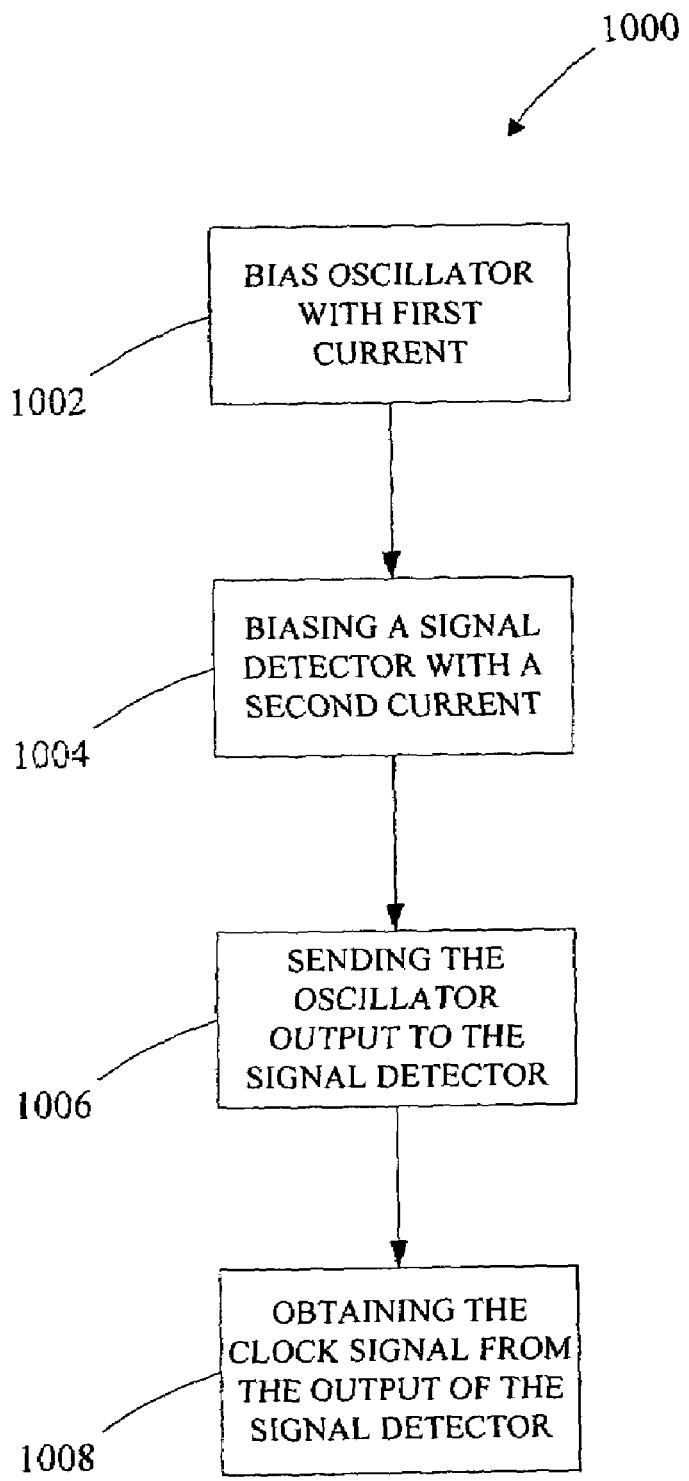
FIG. 10 is a block diagram of a methodology in accordance with an aspect of the present invention.

In view of the foregoing structural and functional features described above, a methodology in accordance with various aspects of the present invention will be better appreciated with reference to FIG. 10. While, for purposes of simplicity of explanation, the methodology of FIG. 10 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 10 is a block diagram of a methodology 1100 in accordance with an aspect of the present invention. The methodology 1100 is for generating a clock signal. At 1102, an oscillator is biased with a first current. The first current can bias the oscillator within a predetermined range to limit the output voltage of the oscillator thereby controlling the power consumption of the oscillator. At 1104 a signal detector is biased by a second current. At 1106 the output of the oscillator are sent to the signal detector. The signal detector can be biased to produce an output with a higher voltage than the output of the oscillator. The output of the oscillator, which is at a reduced voltage is amplified by the signal detector, the signal detector producing an output that of greater magnitude than the output of the oscillator. This enables the oscillator to operate at a lower power consumption level. At 1108, a clock signal is obtained from the output of the signal detector.

The signal detector can employ a differential amplifier with differential inputs coupled to the two outputs of the oscillator to produce the clock signal. One differential input can be coupled to a constant source (e.g., a constant voltage or current source or ground) while the other input is coupled to an output from the oscillator. Alternatively, the oscillator can have two outputs, both of which can be input into the differential amplifier. The output of the differential amplifier can be based on the difference between the oscillator outputs. The output of the signal detector can be inverted. An inverter can be employed to functions as a buffer. The inverter would invert the output of the oscillator, i.e., when the oscillator output is high the inverter produces a low output and when the oscillator output is low the inverter produces a high output.

The method can further comprise biasing a voltage reference circuit with a third current. The voltage reference circuit can be configured to provide a voltage that is relative to the first current.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims interpreted in accordance with the breadth to which they are fairly, legally and equitably entitled.

The invention claimed is:

1. A real time clock, comprising:
   a regulator comprising a first current source and a second current source;
   an oscillator coupled to the first current source, the oscillator comprising a first oscillator output;
   a voltage reference circuit coupled to the second current source and producing a reference voltage; and
   digital logic comprising transistors having a threshold voltage;
   wherein the voltage reference circuit comprises two monitor transistors that generate a reference voltage proportional to the threshold voltage of the transistors in the digital logic.

2. The real time clock of claim 1, wherein the first current source limits the amount of current to the oscillator.

3. The real time clock of claim 1, wherein the first current source produces a limited current, and the oscillator is responsive to the limited current to produce a voltage at the oscillator output lower than the reference voltage.

4. The real time clock of claim 1 further comprising:
   the oscillator comprises a second output; and
   a signal detector comprising two inputs and one output, the first input receiving the first oscillator output and the second input receiving a second oscillator output.

5. The real time clock of claim 4, wherein the output of the signal detector provides a clocking signal.

6. The real time clock of claim 5, the signal detector comprising:
   a differential amplifier coupled to the second current source, the differential amplifier receiving a first input from the first oscillator output and receiving a second input from the second oscillator output, the output of the differential amplifier providing the clocking signal.

7. The real time clock of claim 6, the differential amplifier further comprising:
   a first transistor and a second transistor coupled to the second current source;

a current mirror comprising a third transistor and a fourth transistor, the third transistor coupled to the first transistor and the fourth transistor coupled to the second transistor;

a fifth transistor, the gate of the fifth transistor coupled to the gate of the first transistor; and a sixth transistor coupled between the fifth transistor and the third transistor, the gate of the sixth transistor coupled to the clocking signal and the sixth transistor configured to be in an off state when the clocking signal is above a first predetermined level and in an on state when the clocking signal is below a second predetermined level.

8. A real time clock, comprising:

a regulator, the regulator comprising a first current source and a second current source;

an oscillator coupled to the first current source, the oscillator comprising a first oscillator output and a second oscillator output;

a voltage reference circuit coupled to the second current source and producing a reference voltage; and a signal detector, the signal detector comprising two inputs and an output, the first input receiving the first oscillator output and the second input receiving the second oscillator output.

9. The real time clock of claim 8, wherein the first current source limits the amount of current to the oscillator.

10. The real time clock of claim 8, wherein the first current source produces a limited current, the oscillator being responsive to the limited current to produce a voltage at the oscillator output lower than the reference voltage.

11. A real time clock of claim 10, wherein the output of the detector provides a clocking signal.

12. The real time clock of claim 11, the signal detector comprising:

a differential amplifier coupled to the second current source, the differential amplifier receiving a first input from the first oscillator output and receiving a second input from the second oscillator output, the output of the differential amplifier providing the clocking signal.

13. The real time clock of claim 12, the differential amplifier further comprising:

a first transistor and a second transistor coupled to the second current source;

a current mirror comprising a third transistor and a fourth transistor, the third transistor coupled to the first transistor and the fourth transistor coupled to the second transistor;

a fifth transistor, the gate of the fifth transistor coupled to the gate of the first transistor; and a sixth transistor coupled between the fifth transistor and the third transistor, the gate of the sixth transistor coupled to the clocking signal and the sixth transistor configured to be in an off state when the clocking signal is above a first predetermined level and in an on state when the clocking signal is below a second predetermined level.

14. A real time clock, comprising:

a first current source;

a second current source;

an oscillator coupled to the first current source, the oscillator comprising first and second oscillator outputs; and a signal detector, the signal detector comprising two inputs and one output, the first input receiving the first oscillator output and the second input receiving the second oscillator output and producing a clocking signal based on the first oscillator output and the second oscillator output, the signal detector comprising: a differential amplifier coupled to the second current source, the differential amplifier receiving a first input from the first oscillator output and receiving a second input from the second oscillator output, the output of the differential amplifier providing the clocking signal;

wherein the differential amplifier further comprises:

a first transistor and a second transistor coupled to the second current source;

a current mirror comprising a third transistor and a fourth transistor, the third transistor coupled to the first transistor and the fourth transistor coupled to the second transistor;

a fifth transistor, the gate of the fifth transistor coupled to the gate of the first transistor; and a sixth transistor coupled between the fifth transistor and the third transistor, the gate of the sixth transistor coupled to the clocking signal and the sixth transistor configured to be in an off state when the clocking signal is above a first predetermined level and in an on state when the clocking signal is below a second predetermined level.

15. The real time clock of claim 14, wherein the first transistor has a predetermined channel width, the second transistor has a channel width that is approximately twice the channel width of the first transistor, and the fifth transistor has a channel width that is approximately eight times the width of the first transistor.

16. The real time clock of claim 14, wherein the first current source limits the amount of current to the oscillator.

17. The real time clock of claim 14, wherein the first current source produces a lower amount of current than the second current source.

18. The real time clock of claim 14, wherein the sum of the currents supplied by the first current source and the second current source is equal to or below a predetermined threshold current.

\* \* \* \* \*

UNITED STATES PATENT AND TRADEMARK OFFICE
CERTIFICATE OF CORRECTION

PATENT NO. : 7,227,426 B2  
APPLICATION NO. : 11/049420  
DATED : June 5, 2007  
INVENTOR(S) : Masao Kaizuka It is certified that error appears in the above-identified patent and that said Letters Patent is hereby corrected as shown below:

In the Drawings  
Replace Fig. 4 with the following:

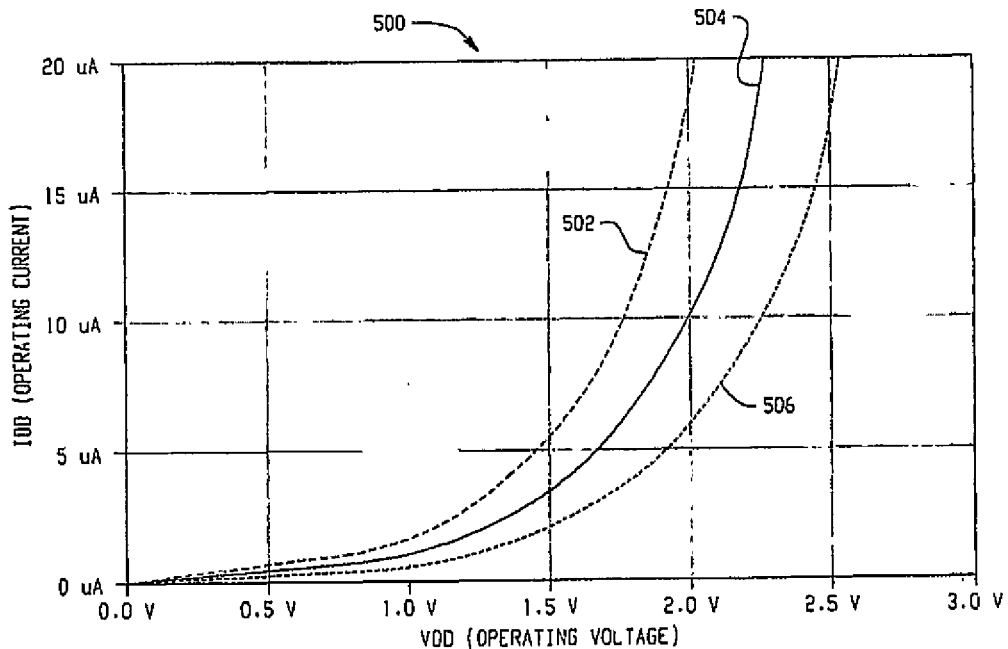

UNITED STATES PATENT AND TRADEMARK OFFICE
CERTIFICATE OF CORRECTION

| | | |
|---|---|---|
| PATENT NO. | : 7,227,426 B2 | |
| APPLICATION NO. | : 11/049420 | |
| DATED | : June 5, 2007 | |
| INVENTOR(S) | : Masao Kaizuka | |

It is certified that error appears in the above-identified patent and that said Letters Patent is hereby corrected as shown below:

In the Drawings
Replace Fig. 5 with the following:

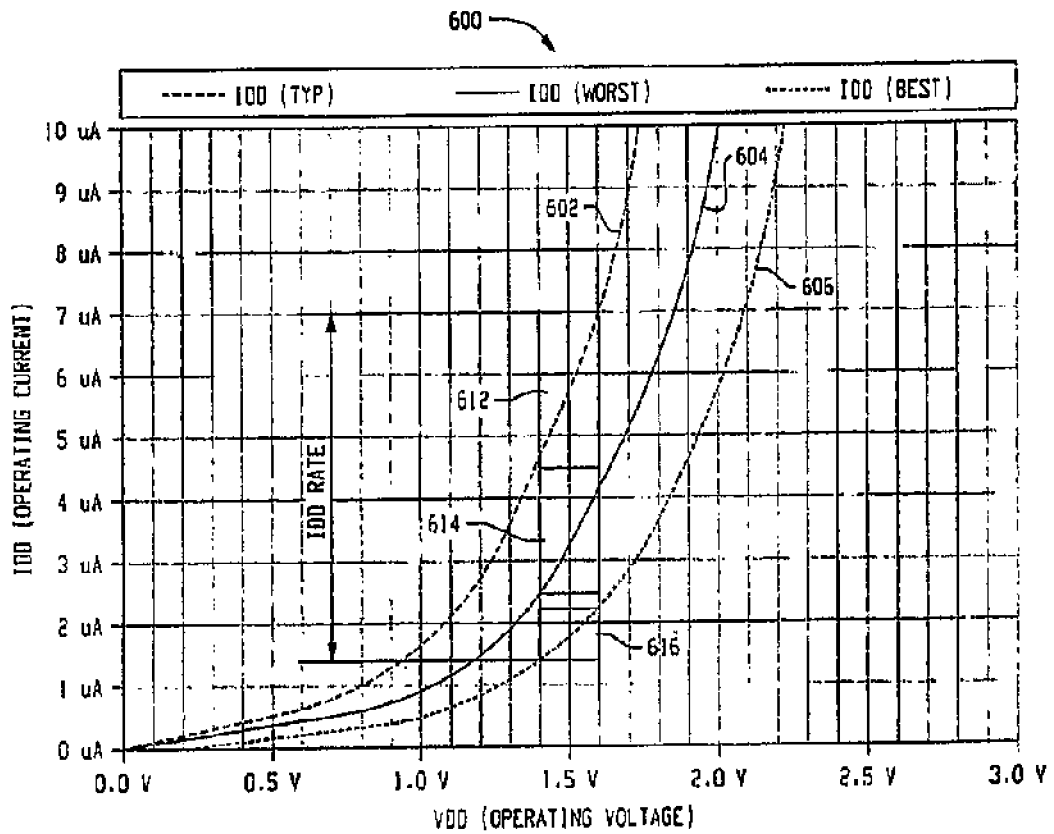

UNITED STATES PATENT AND TRADEMARK OFFICE
CERTIFICATE OF CORRECTION

PATENT NO. : 7,227,426 B2
APPLICATION NO. : 11/049420
DATED : June 5, 2007
INVENTOR(S) : Masao Kaizuka It is certified that error appears in the above-identified patent and that said Letters Patent is hereby corrected as shown below:

In the Drawings
Replace Fig. 6 with the following:

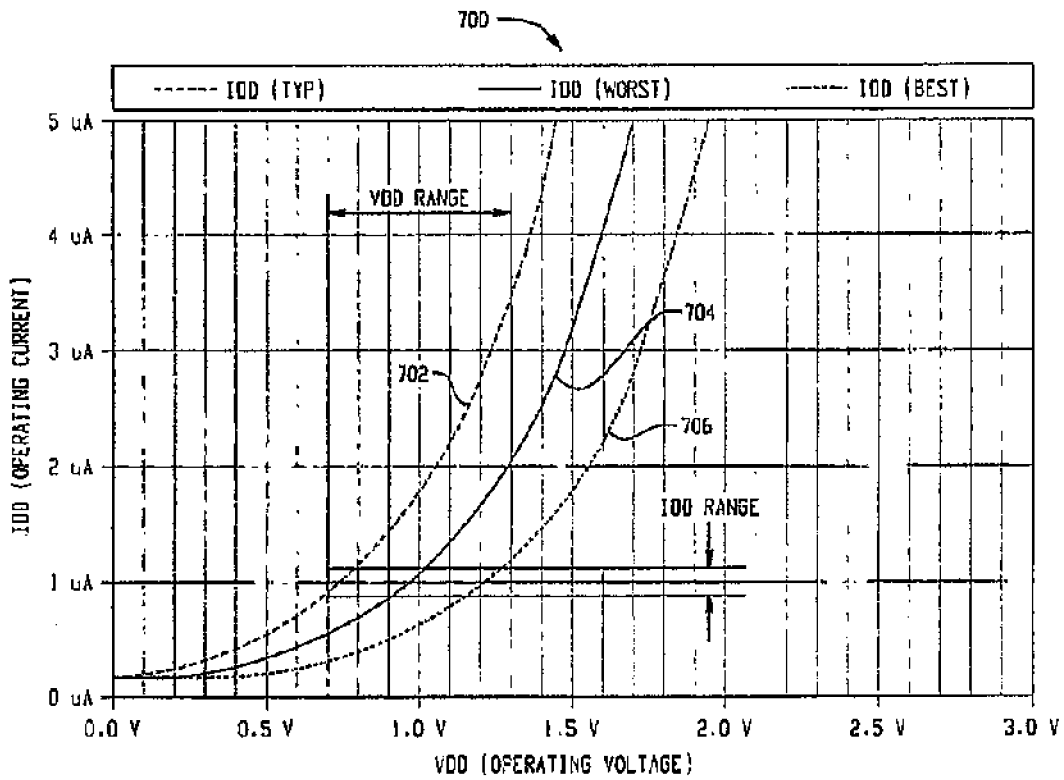

UNITED STATES PATENT AND TRADEMARK OFFICE
CERTIFICATE OF CORRECTION

PATENT NO. : 7,227,426 B2  Page 4 of 4
APPLICATION NO. : 11/049420
DATED : June 5, 2007
INVENTOR(S) : Masao Kaizuka It is certified that error appears in the above-identified patent and that said Letters Patent is hereby corrected as shown below:

In the Drawings:
Replace Fig. 9 with the following:

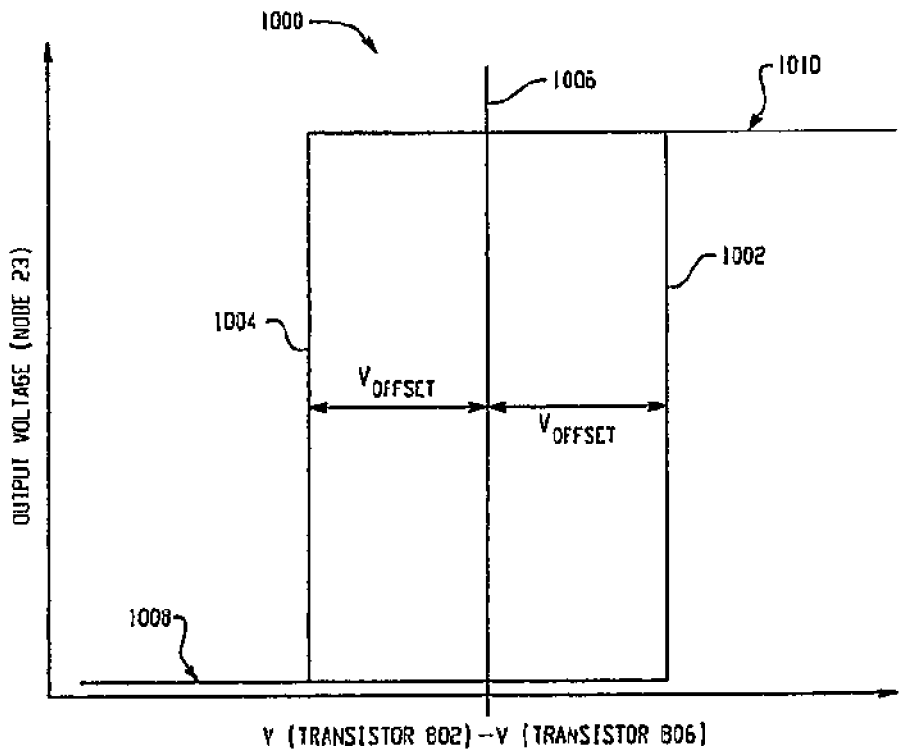

Signed and Sealed this

Twenty-seventh Day of November, 2007

JON W. DUDAS
*Director of the United States Patent and Trademark Office*